United States Patent
Lee et al.

(10) Patent No.: US 10,186,545 B2
(45) Date of Patent: Jan. 22, 2019

(54) IMAGE SENSOR INCLUDING VISIBLE AND NEAR-INFRARED LIGHT DETECTORS AND METHOD OF MANUFACTURING THE SAME

(71) Applicant: Samsung Electronics Co., Ltd., Suwon-si, Gyeonggi-do (KR)

(72) Inventors: Jaeho Lee, Seoul (KR); Kiyoung Lee, Seoul (KR); Sangyeob Lee, Hwaseong-si (KR); Eunkyu Lee, Yongin-si (KR); Jinseong Heo, Seoul (KR); Seongjun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 6 days.

(21) Appl. No.: 15/244,073

(22) Filed: Aug. 23, 2016

(65) Prior Publication Data
US 2017/0243913 A1    Aug. 24, 2017

(30) Foreign Application Priority Data
Feb. 24, 2016 (KR) ........................ 10-2016-0022022

(51) Int. Cl.
*H01L 27/146* (2006.01)
*H01L 31/032* (2006.01)
*H01L 31/0352* (2006.01)
*H01L 31/109* (2006.01)

(52) U.S. Cl.
CPC .. *H01L 27/14649* (2013.01); *H01L 27/14621* (2013.01); *H01L 27/14645* (2013.01); *H01L 27/14647* (2013.01); *H01L 27/14689* (2013.01); *H01L 31/032* (2013.01); *H01L 31/035227* (2013.01); *H01L 31/109* (2013.01)

(58) Field of Classification Search
None
See application file for complete search history.

(56) References Cited

U.S. PATENT DOCUMENTS

| | | | |
|---|---|---|---|
| 8,581,964 B2 | 11/2013 | Sul et al. | |
| 9,157,789 B2 | 10/2015 | Ogawa et al. | |
| 2011/0102547 A1* | 5/2011 | Sul | H01L 27/14621 348/46 |
| 2011/0228097 A1 | 9/2011 | Motta | |
| 2013/0009129 A1 | 1/2013 | Sargent et al. | |

(Continued)

FOREIGN PATENT DOCUMENTS

| | | |
|---|---|---|
| JP | 2015045629 A | 3/2015 |
| KR | 20110049002 A | 5/2011 |
| KR | 20140037702 A | 3/2014 |

OTHER PUBLICATIONS

James E. Carey et al. "IR Detectors: Black Silicon sees further into the IR". Laser Focus World: Photonics Technologies & Solutions for Technical Professionals Worldwide. Aug. 2009. pp. 1-7.

(Continued)

*Primary Examiner* — Daniel Whalen
(74) *Attorney, Agent, or Firm* — Harness, Dickey & Pierce, P.L.C.

(57) ABSTRACT

An image sensor may include visible light detectors and a near-infrared light detector. The near-infrared light detector may contain a material highly sensitive to near-infrared rays, and thus the size of the near-infrared light detector may be reduced.

17 Claims, 12 Drawing Sheets

(56) References Cited

U.S. PATENT DOCUMENTS

| | | | | |
|---|---|---|---|---|
| 2013/0119234 A1* | 5/2013 | Lee | ................... | H01L 31/103 |
| | | | | 250/208.1 |
| 2013/0214161 A1* | 8/2013 | Cazaux | ............. | H01L 27/14621 |
| | | | | 250/338.4 |
| 2015/0048378 A1* | 2/2015 | Maruyama | .......... | H01L 27/1464 |
| | | | | 257/76 |

OTHER PUBLICATIONS

Zhenan Sun et al. "Technology Roadmap for Smart Iris Recognition". Center for Biometrics and Security Research & National Laboratory of Pattern Recognition Institute of Automation, Chinese Academy of Sciences. Jan. 2008.

Sungjoo Lee et al. "A Study on Fake Iris Detection based on the Reflectance of the Iris to the Sclera for Iris Recognition". ITC-CSCC: International Techinical Conference on Circuits Systems, Computers and Communications. The Institute of Electronics Engineers of Korea. Jul. 2005. pp. 1555-1556.

Z.P. Ling et al. "Large-scale two-dimensional MoS2 photodetectors by magnetron sputtering". Optical Society of America. May 2015.

* cited by examiner

IMAGE SENSOR INCLUDING VISIBLE AND NEAR-INFRARED LIGHT DETECTORS AND METHOD OF MANUFACTURING THE SAME

CROSS-REFERENCE TO RELATED APPLICATION

This application claims the benefit of Korean Patent Application No. 10-2016-0022022, filed on Feb. 24, 2016, in the Korean Intellectual Property Office, the disclosure of which is incorporated herein in its entirety by reference.

BACKGROUND

1. Field

Example embodiments relate to image sensors and/or methods of manufacturing the image sensors. For example, at least some example embodiments relate to image sensors including near-infrared light detectors and/or methods of manufacturing the image sensors.

2. Description of the Related Art

In general, color displays and color image sensors may display multicolor images or may detect colors of light incident thereon by using color filters. For example, devices such as a charge coupled device (CCD) or a complementary metal oxide semiconductor (CMOS) may be used as image sensors.

Most color displays or color image sensors use a RGB color filter structure in which, for example, green filters are arranged in two of four pixels and blue and red filters are arranged in the other two pixels. In addition to the RGB color filter structure, a CYGM color filter structure in which complementary cyan, yellow, green, and magenta color filters are respectively arranged in four pixels is used.

The sensitivity of color image sensors may be lower in a near-infrared wavelength band than in a visible wavelength band. Therefore, the image quality of color image sensors may be relatively poor when used in low-illumination conditions. In addition, the use of iris-recognizing image sensors has recently increased. However, since the sensitivity of iris-recognizing image sensors may be relatively low under low-illumination conditions, additional light sources may be required. However, if a high-power light source is used, the eyes may be negatively affected. In addition, the resolution of an image sensor may be increased for iris recognition by increasing the number of pixels thereof. However, if the size of image sensors of cameras included in smartphones is increased, it may be difficult to decrease the size of the cameras or smartphones.

SUMMARY

Provided are image sensors having improved responsivity in a low-illumination environment.

Provided are image sensors for iris recognition.

Provided are methods of simply manufacturing image sensors.

Additional aspects will be set forth in part in the description which follows and, in part, will be apparent from the description, or may be learned by practice of the presented embodiments.

In some example embodiments, the image sensor may include a plurality of color filters configured to transmit light of different wavelength bands; a light sensing layer including a plurality of visible light detectors and at least one near-infrared light detector, each of the plurality of visible light detectors and the at least one near-infrared light detector corresponding to one of the plurality of color filters; and a signal processing layer configured to convert an optical signal detected by the light sensing layer into an electric signal.

In some example embodiments, the at least one near-infrared light detector is configured to detect light in a wavelength band ranging from about 800 nm to about 900 nm.

In some example embodiments, the at least one near-infrared light detector includes a material having a band gap of less than or equal to about 1.38 eV.

In some example embodiments, a material included in at least one near-infrared light detector comprises: at least one transition metal dichalcogenide.

In some example embodiments, the at least one transition metal dichalcogenide comprises: at least one of Molybdenum disulfide ($MoS_2$), Molybdenum Selenide ($MoSe_2$), Molybdenum ditelluride ($MoTe_2$), Tungsten diselenide ($WSe_2$), Tungsten(IV) telluride ($WTe_2$), and Hafnium telluride ($HfTe_2$).

In some example embodiments, the at least one near-infrared light detector and the plurality of visible light detectors are in a same plane.

In some example embodiments, the at least one near-infrared light detector comprises: a first layer including at least one transition metal dichalcogenide; and a second layer including a semiconductor material.

In some example embodiments, the semiconductor material included in the second layer comprises silicon.

In some example embodiments, the plurality of visible light detectors and the at least one near-infrared light detector are a same size.

In some example embodiments, a material included in the at least one near-infrared light detector includes black silicon.

In some example embodiments, the image sensor further includes a common electrode between the light sensing layer and the plurality of color filters, and pixel electrodes in the signal processing layer.

In some example embodiments, a material included in the plurality of visible light detectors includes silicon.

Some example embodiments relate to a method of manufacturing an image sensor.

In some example embodiments, the method includes forming a silicon layer on a signal processing layer; etching a region of the silicon layer; arranging a near-infrared light detecting material in the etched region; and forming a color filter layer on the silicon layer and the near-infrared light detecting material.

In some example embodiments, the etching includes etching the region of the silicon layer to a partial depth, and the arranging includes arranging the near-infrared light detecting material in the etched region to the partial depth.

In some example embodiments, the near-infrared light detecting material is configured to detect light in a wavelength band ranging from about 800 nm to about 900 nm.

In some example embodiments, the near-infrared light detecting material comprises: a material having a band gap of less than or equal to about 1.38 eV.

In some example embodiments, the near-infrared light detecting material comprises: at least one transition metal dichalcogenide.

In some example embodiments, the near-infrared light detecting material includes at least one of Molybdenum disulfide ($MoS_2$), Molybdenum Selenide ($MoSe_2$), Molybdenum ditelluride (MoTe$_2$), Tungsten diselenide (WSe$_2$), Tungsten(IV) telluride (WTe$_2$), and Hafnium telluride (HfTe$_2$).

In some example embodiments, a material included in the near-infrared light detecting material includes black silicon.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Reference will now be made in detail to example embodiments, examples of which are illustrated in the accompanying drawings, wherein like reference numerals refer to like elements throughout. In this regard, the present embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Image sensors and methods of manufacturing the image sensors will now be described with reference to the accompanying drawings according to embodiments. However, the idea and scope of the present disclosure are not limited to the example embodiments, and it should be understood that various modifications, equivalents, and alternatives of the example embodiments can be made within the idea and technical scope of the present disclosure. In the accompanying drawings, similar reference numerals may be used for similar elements.

In the drawings, like reference numbers refer to like elements, and the size of each element may be exaggerated for clarity of illustration. It will be understood that although the terms "first", "second", etc. may be used herein to describe various components, these components should not be limited by these terms. These terms are only used to distinguish one element from another.

As used herein, the singular forms "a," "an" and "the" are intended to include the plural forms as well, unless the context clearly indicates otherwise. It will be further understood that the terms "comprises," "comprising," "includes," and/or "including used herein specify the presence of stated features or elements, but do not preclude the presence or addition of one or more other features or elements.

In the present disclosure, terms such as units or modules are used to denote a unit having at least one function or performing at least one operation and implemented with hardware, software, or a combination of hardware and software. In addition, expressions such as "A is provided on B" may be construed that A is provided to B in a contact or non-contact manner.

Figure 1:
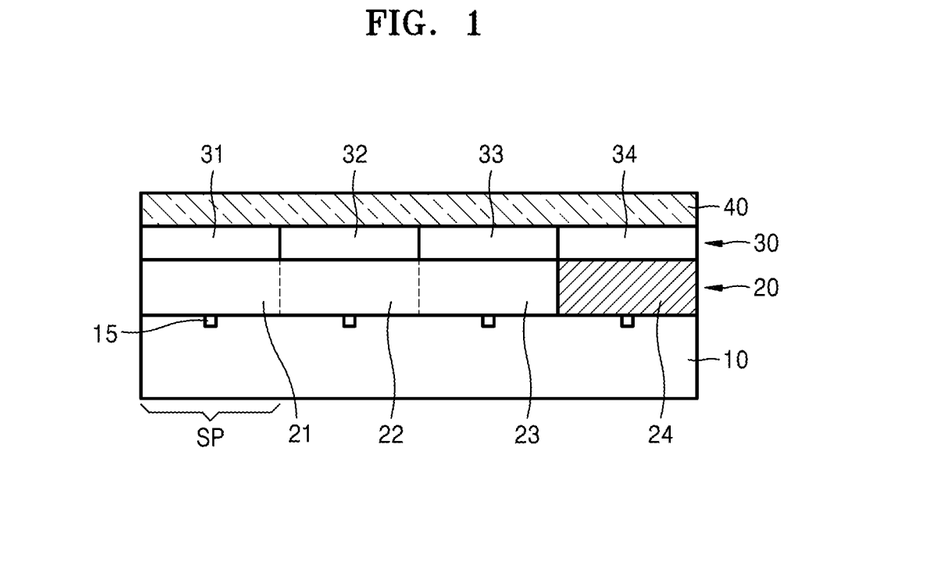
FIG. 1 is a schematic view illustrating an image sensor according to an example embodiment.

FIG. 1 is a view illustrating an image sensor according to an example embodiment.

Referring to FIG. 1, in some example embodiments, the image sensor may include: a plurality of color filters 30 transmitting light of different wavelengths; and a light sensing layer 20 including a plurality of visible light detectors corresponding to the color filters 30 and at least one near-infrared light detector.

For example, the color filters 30 may include a first color filter 31 transmitting light in a first wavelength band, a second color filter 32 transmitting light in a second wavelength band, a third color filter 33 transmitting light in a third wavelength band, and a fourth color filter 34 transmitting light in a fourth wavelength band.

For example, the first color filter 31 may transmit light in a red wavelength band, the second color filter 32 may transmit light in a green wavelength band, the third color filter 33 may transmit light in a blue wavelength band, and the fourth color filter 34 may transmit light in a near-infrared wavelength band. Alternatively, the fourth color filter 34 may transmit red, green, and blue light. In this case, near-infrared light may be detected by subtracting transmitted light from the entire light. Alternatively, the first color filter 31 may transmit cyan light, the second color filter 32 may transmit magenta light, the third color filter 33 may transmit yellow light, and the fourth color filter 34 may transmit near-infrared light. As described above, the color filters 30 may be variously configured. The near-infrared wavelength band may range from about 800 nm to about 900 nm.

For example, the light sensing layer 20 may include first, second, and third light detectors 21, 22, and 23 configured to detect visible light, and a fourth light detector 24 configured to detect near-infrared light. The light detectors may correspond to the color filters 30. For example, light passing through the first color filter 31 may be detected by the first light detector 21, light passing through the second color filter 32 may be detected by the second light detector 22, light passing through the third color filter 33 may be detected by the third light detector 23, and light passing through the fourth color filter 34 may be detected by the fourth light detector 24. The fourth light detector 24 may detect light in a near-infrared wavelength band ranging from about 800 nm to about 900 nm.

The near-infrared light detector may include a material sensitive to near-infrared light. For example, the near-infrared light detector may include a material having a band gap of about 1.38 eV or less. The near-infrared light detector may include at least one transition metal dichalcogenide.

Transition metal dichalcogenide (TMDC) may be an atomically thin semiconductors of the type MX$_2$, with M being a transition metal atom (Mo, W, Hf, etc.) and X a chalcogen atom (S, Se, or Te.) such that one layer of the M atoms is sandwiched between two layers of the X atoms.

The near-infrared light detector may include at least one of Molybdenum disulfide (MoS$_2$), Molybdenum Selenide (MoSe$_2$), Molybdenum ditelluride (MoTe$_2$), Tungsten diselenide (WSe$_2$), Tungsten(IV) telluride (WTe$_2$), and Hafnium telluride (HfTe$_2$).

The transition metal dichalcogenide may be highly sensitive to near-infrared light. Therefore, the near-infrared light detector may have a high degree of responsivity to near-infrared light in low-illumination environments, and thus even though the size of the near-infrared light detector is reduced, the near-infrared light detecting efficiency of the near-infrared light detector may be high.

For example, the visible light detectors may include silicon. The quantum efficiency of a silicon light detector is higher in a visible light band than in a near-infrared light band. Therefore, it is difficult to detect near-infrared light using a silicon light detector, and also, in a poorly illuminated place, it is more difficult to detect near-infrared light using a silicon light detector.

In some example embodiments, the near-infrared light detector includes a material having a high degree of responsivity or external quantum efficiency with respect to near-infrared light, and thus the efficiency of detecting near-infrared light may be increased even in low-illumination environments. As described above, the near-infrared light detector includes a material having a high degree of near-infrared light detection efficiency and a high degree of responsivity to near-infrared light, and thus the near-infrared light detector and the visible light detectors may have the same size. Therefore, degree of freedom may be increased when the position or size of the near-infrared light detector is determined, and the image sensor including the near-infrared light detector may be applied to various products.

The first to fourth light detectors 21 to 24 may be arranged side by side in the same layer. That is, the near-infrared light detector and the visible light detectors may be arranged in the same plane. In addition, the first to fourth light detectors 21 to 24 may have the same size (or area).

The first to third light detectors 21 to 23 may detect visible light. For example, the first to third light detectors 21 to 23 may include a silicon-containing material. The first to third light detectors 21 to 23 may include the same material and thus may not be distinguished from each other. A portion of the light sensing layer 20 corresponding to the first color filter 31 may be the first light detector 21, a portion of the light sensing layer 20 corresponding to the second color filter 32 may be the second light detector 22, and a portion of the light sensing layer 20 corresponding to the third color filter 33 may be the third light detector 23. Regions corresponding to the first to fourth color filters 31 to 34 may be sub-pixels SP, respectively, and a group of the sub-pixels SP may form a pixel.

A pixel may be a minimum unit capable of processing light according to colors. For example, referring to FIG. 1, a group including the first to fourth color filters 31 to 34 may form a pixel. Regions of the pixel respectively corresponding to colors may be sub-pixels SP. In FIG. 1, only one pixel is illustrated. Such pixels may be arranged in a matrix form. However, the arrangement of pixels is not limited thereto. That is, pixels may be arranged in various forms. The size of the image sensor may be reduced by increasing the responsivity of the near-infrared light detector. That is, the visible light detectors and the near-infrared light detector having the same size may be arranged in the same pixel in the same plane.

A signal processing layer 10 may be arranged under the light sensing layer 20 so as to convert an optical signal detected by the light sensing layer 20 into an electric signal. For example, the signal processing layer 10 may include an integrated circuit. For example, the signal processing layer 10 may include pixel electrodes 15. A common electrode 40 may be arranged between the light sensing layer 20 and the color filters 30. The common electrode 40 may be a transparent electrode transmitting light. For example, the common electrode 40 may be an indium tin oxide (ITO) or graphene electrode.

Color light beams corresponding to the sub-pixels SP are obtained from light incident on the color filters 30, and the color light beams may generate electrons and holes in the light sensing layer 20. The electrons and holes may move to the common electrode 40 and the pixel electrodes 15, and thus electric signals may be detected. The electric signals produced by the signal processing layer 10 may be used by a processor to display images according to the electric signals obtained via the sub-pixels SP.

In an environment having a large amount of light, clear images may be obtained, and even in a low-illumination environment having a small amount of light, high-quality images may be obtained using, in addition to using visible light, near-infrared light detected by the near-infrared light detector having a high degree of efficiency.

In addition, the image sensor according to at least some example embodiments may be used for sensing the irises of an individual's eyes. It is difficult to distinguish the iris and sclera in a long wavelength band (far-infrared rays). That is, it is difficult to recognize the iris using a far-infrared light detector. Further, in a short wavelength band (visible rays), iris pattern recognition errors may occur because of light reflected from a region around the iris.

For example, in the case of a dark brown or brown pupil, the iris may be recognized using near-infrared light, but it may be difficult to recognize the iris using visible light. In the case of a blue or green pupil, the iris may be recognized using near-infrared light or visible light. That is, in the case of most pupils, the iris may be recognized using near-infrared light. Since the near-infrared light detector of the image sensor of at least some example embodiments has a high degree of sensitivity, the image sensor may be used to capture an image of the iris.

Since the near-infrared light detector has a high degree of sensitivity (responsivity) or a high degree of quantum efficiency, the size of the light sensing layer 20 may be reduced for application to small, slim electronic devices such as smartphones. If the image sensor of example embodiments is used in a smartphone, the rate and precision of iris recognition may be increased. Therefore, the image sensor according to at least some example embodiments may be used for user authentication through iris recognition.

Figure 2:
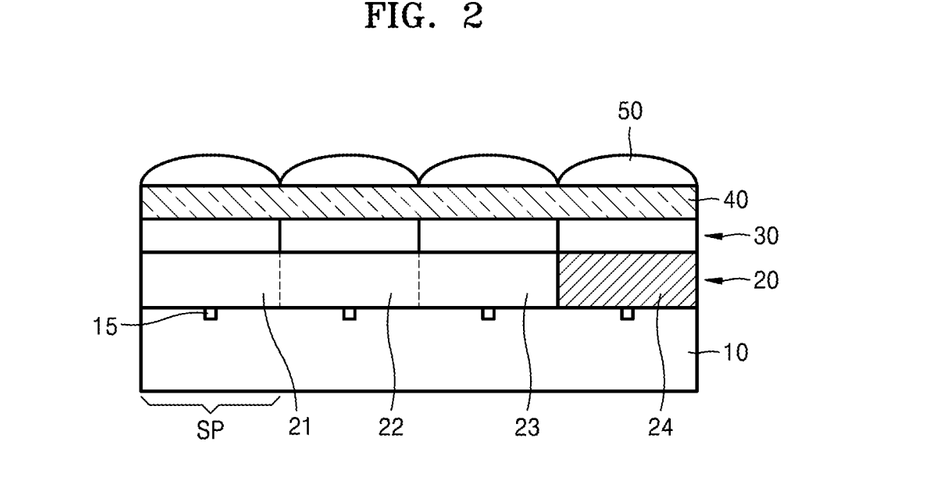
FIG. 2 is a view illustrating an example in which the image sensor of FIG. 1 further includes microlenses.

FIG. 2 illustrates an example in which the image sensor of FIG. 1 further includes microlenses 50.

The microlenses 50 may be arranged on the color filters 30 at positions corresponding to the sub-pixels SP. The microlenses 50 may increase the optical efficiency of the image sensor by condensing light incident on the image sensor. Therefore, relatively clear images may be obtained even in a low-illumination environment.

Figure 3:
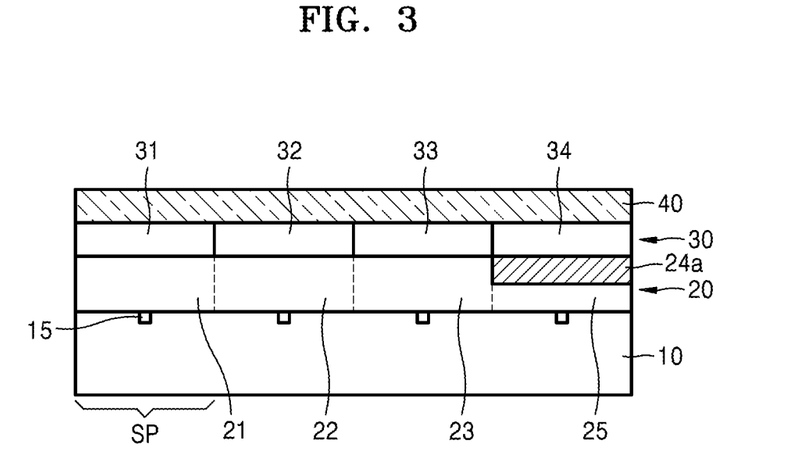
FIG. 3 is a schematic view illustrating an image sensor according to another example embodiment.

FIG. 3 illustrates an example in which the fourth light detector (near-infrared light detector) 24 of the image sensor of FIG. 1 is modified. In FIGS. 1 and 3, like reference numerals denote like elements, and thus detailed descriptions thereof will not be presented here.

Referring to FIG. 3, the near-infrared light detector 24 of the image sensor may include a plurality of layers. For example, the near-infrared light detector 24 may include a first layer 24a and a second layer 25.

For example, the first layer 24a may include at least one transition metal dichalcogenide. The second layer 25 may include a semiconductor material, for example, the second layer 25 may include silicon. However, example embodiments are not limited thereto and the second layer 25 may include other types of semiconductor material. As described above, the near-infrared light detector 24 may have a structure in which different materials are bonded together.

Figure 4:
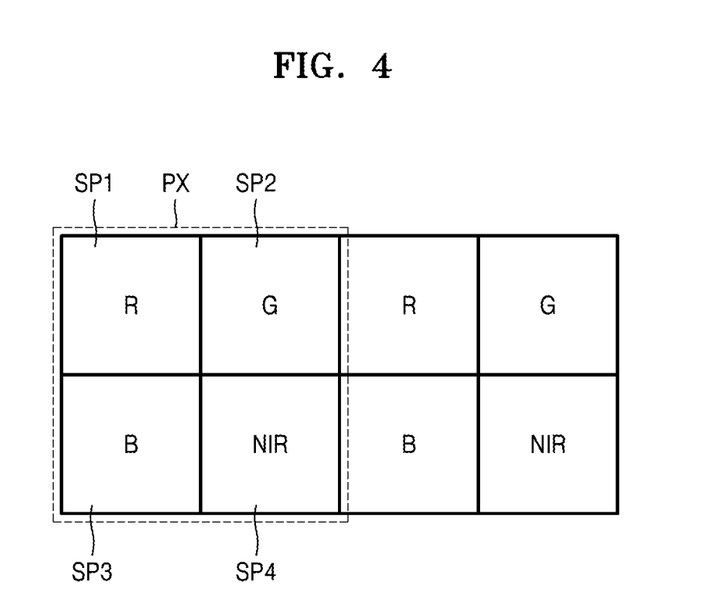
FIG. 4 is a view illustrating an example of a pixel structure of an image sensor according to an example embodiment.

FIG. 4 illustrates an example structure of a pixel PX.

Referring to FIG. 4, for example, the pixel PX may include a plurality of sub-pixels. For example, the pixel PX may include a first sub-pixel SP1, a second sub-pixel SP2, a third sub-pixel SP3, and a fourth sub-pixel SP4. The first sub-pixel SP1 may detect red light, the second sub-pixel SP2 may detect green light, the third sub-pixel SP3 may detect blue light, and the fourth sub-pixel SP4 may detect near-infrared light. For example, the first to fourth sub-pixels SP1 to SP4 may be arranged in a 2×2 matrix form. However, the arrangement of the sub-pixels is not limited thereto. That is, the sub-pixels may be variously arranged. For example, the sub-pixels may be arranged in a row.

Figure 5:
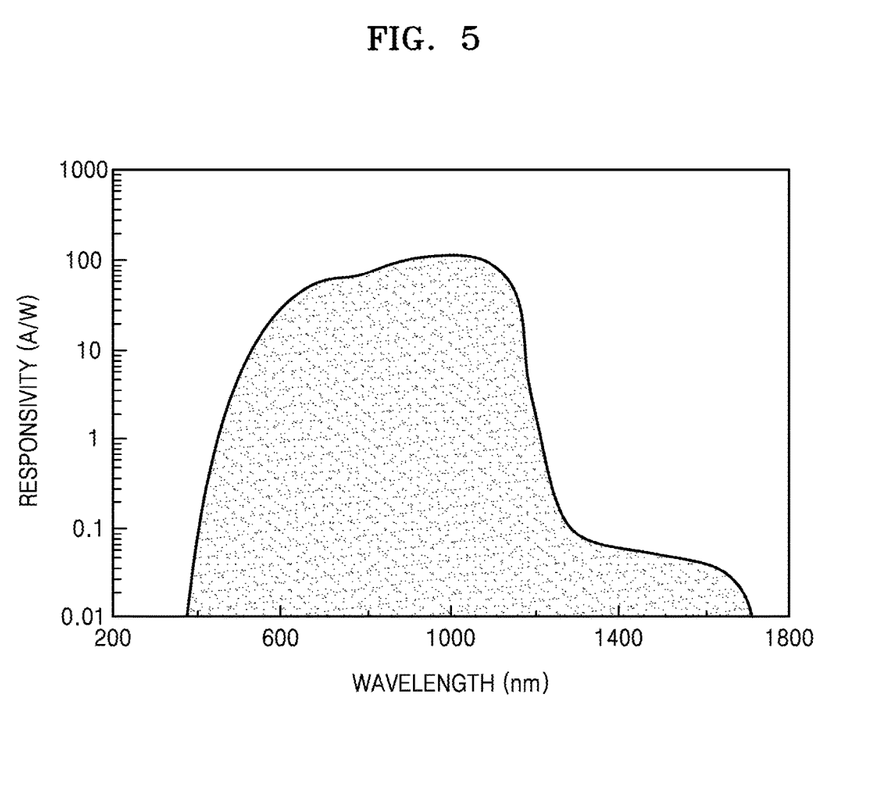
FIG. 5 is a graph illustrating the responsivity of black silicon with respect to wavelength.

FIG. 5 illustrates the responsivity of black silicon with respect to wavelength.

Referring to FIG. 5, the responsivity of black silicon is relatively high in a visible wavelength band (e.g., from about 390 to about 700 nm) and a near-infrared wavelength band (e.g., from about 800 nm to about 900 nm). Therefore, since the near-infrared light detector of the image sensor of at least some example embodiments includes black silicon, the light sensing efficiency of the near-infrared light detector may be increased.

Figure 6:
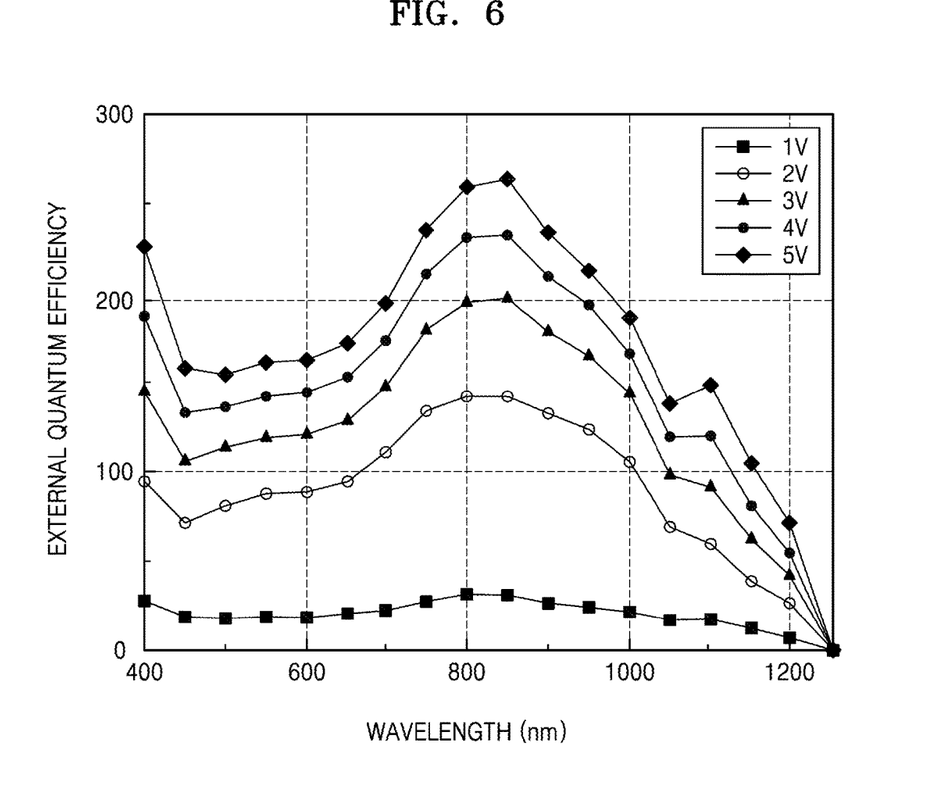
FIG. 6 is a graph illustrating the external quantum efficiency of MoS$_2$ with respect to wavelength.

FIG. 6 is a graph illustrating the external quantum efficiency of Molybdenum disulfide ($MoS_2$) with respect to wavelength for different voltages.

Referring to FIG. 6, the external quantum efficiency of Molybdenum disulfide ($MoS_2$) is relatively high in a near-infrared wavelength band. The near-infrared light detector may be formed using a material including at least one transition metal dichalcogenide such as $MoS_2$ so as to increase the sensing efficiency of the near-infrared light detector. Thus, although the size of the near-infrared light detector is reduced, the sensitivity of the near-infrared light detector in low-illumination conditions may be increased.

FIGS. 7 to 14 are views illustrating a method of manufacturing an image sensor according to an example embodiment.

Figure 7:
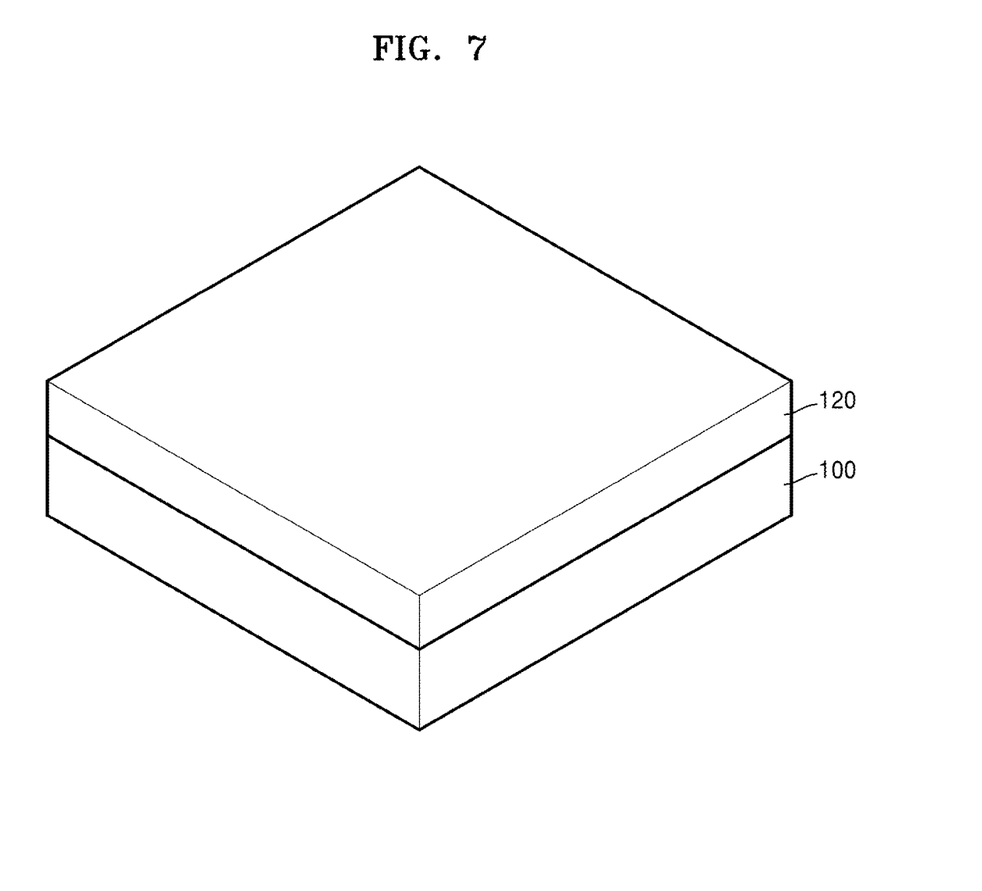
FIGS. 7 to 14 are views illustrating a method of manufacturing an image sensor according to an example embodiment.

Referring to FIG. 7, a silicon layer 120 may be formed on a signal sensing layer 100. For example, the silicon layer 120 may be deposited on the signal sensing layer 100 or transferred to the signal sensing layer 100.

Figure 8:
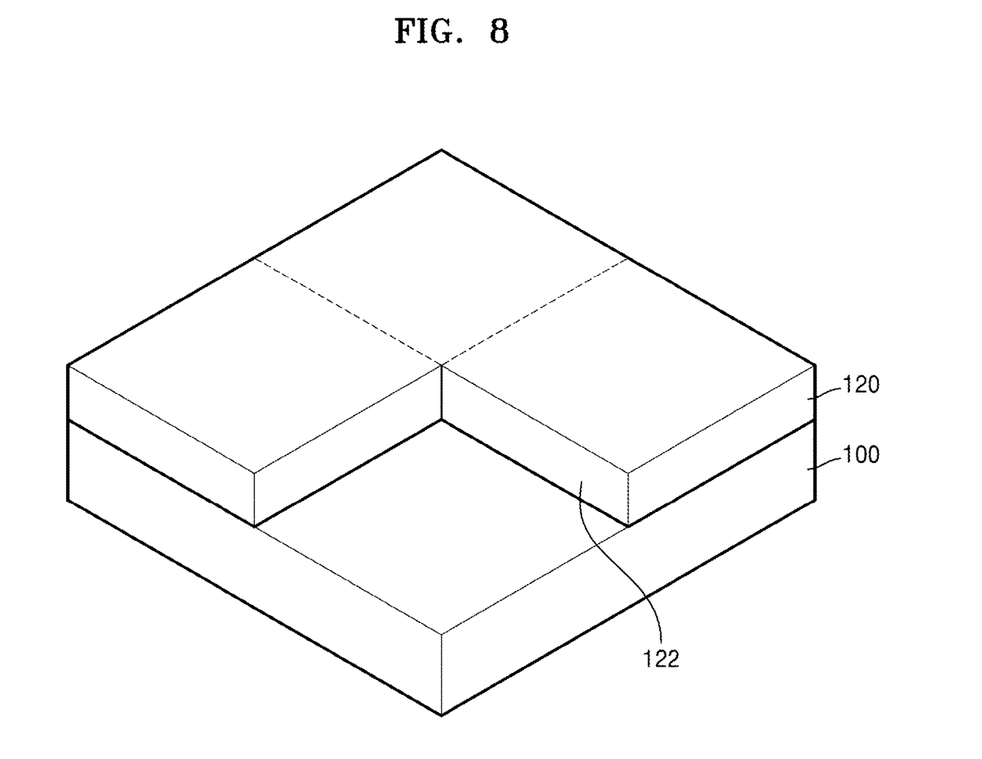

Referring to FIG. 8, a region 122 of the silicon layer 120 may be etched using a mask (not shown). After the silicon layer 120 is etched, the signal sensing layer 100 may be exposed.

Figure 9:
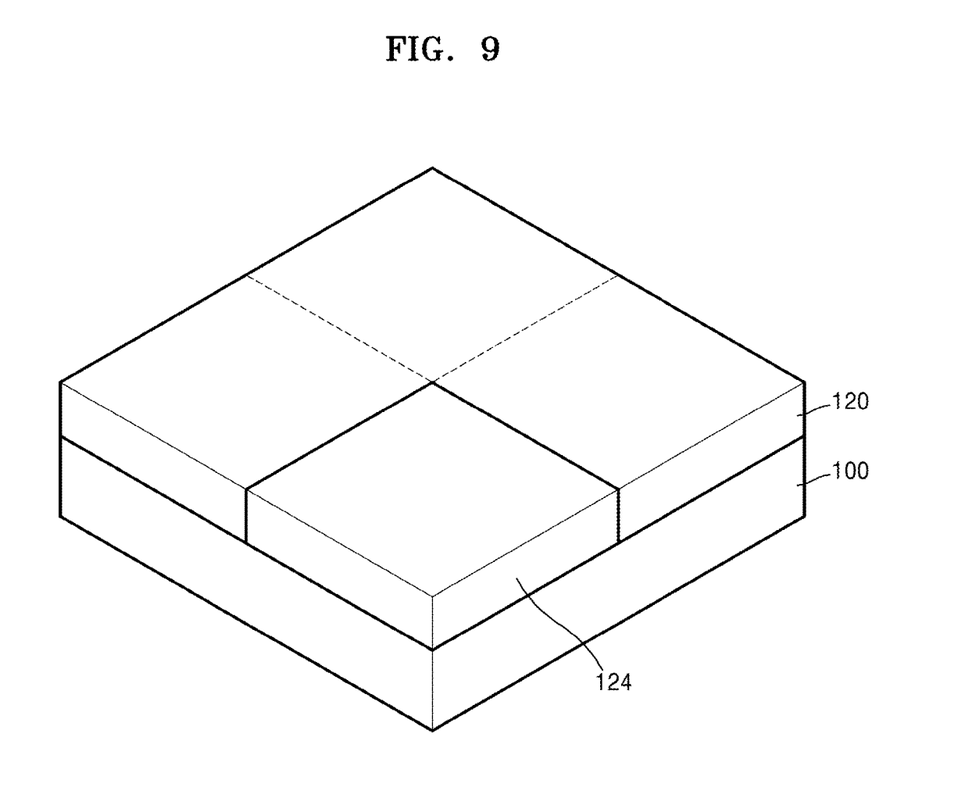

Referring to FIG. 9, a near-infrared light detecting material 124 may be arranged in the etched region 122. The near-infrared light detecting material 124 may include a material sensitively responding to light having a wavelength band of about 800 nm to about 900 nm.

For example, the near-infrared light detecting material 124 may include a material having a band gap of about 1.38 eV or less. For example, the near-infrared light detecting material 124 may include at least one transition metal dichalcogenide. For example, the near-infrared light detecting material 124 may include at least one of Molybdenum disulfide ($MoS_2$), Molybdenum Selenide ($MoSe_2$), Molybdenum ditelluride ($MoTe_2$), Tungsten diselenide ($WSe_2$), Tungsten(IV) telluride ($WTe_2$), and Hafnium telluride ($HfTe_2$).

Alternatively, the near-infrared light detecting material 124 may include black silicon. The black silicon may be a needle-shaped surface structure where needles are made of single-crystal silicon to form a so-called effective medium where there is no sharp interface, but a continuous change of the refractive index that reduces Fresnel reflection.

Regions of the silicon layer 120 shown in FIG. 9 may be used as visible light detectors. Dashed lines may indicate regions corresponding to sub-pixels. The region of the near-infrared light detecting material 124 and the other regions corresponding to sub-pixels may have the same size.

Figure 10:
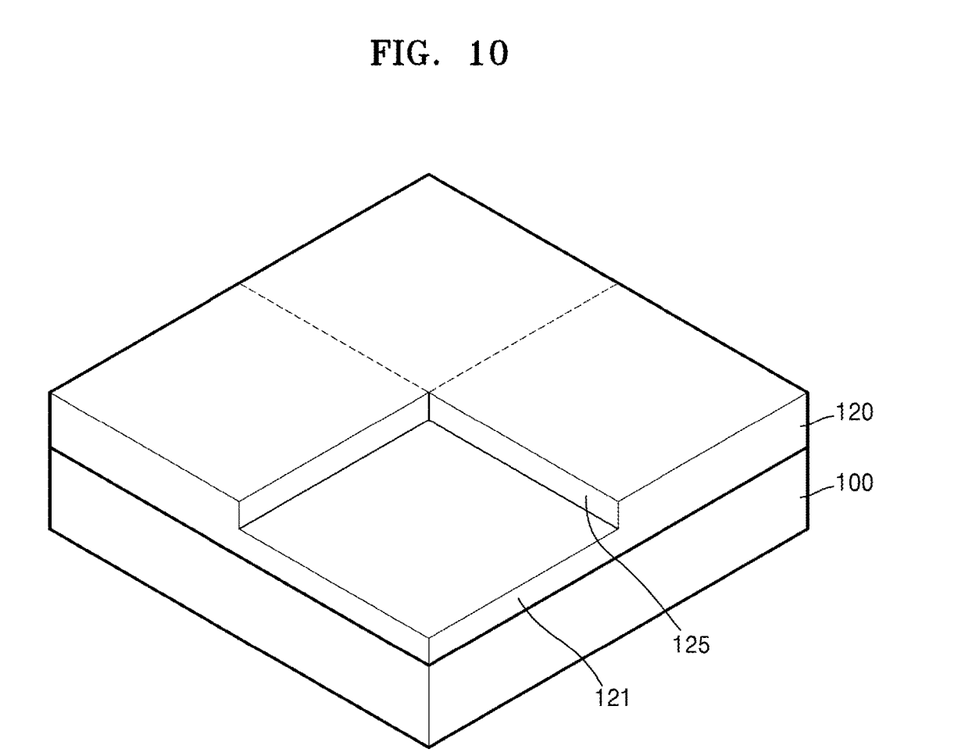

FIG. 10 illustrates an example embodiment in which a region of the silicon layer 120 shown in FIG. 7 is etched to a partial depth of the silicon layer 120.

Referring to FIG. 10, the silicon layer 120 may include an etched-away portion 125 and a remaining portion 121.

Figure 11:
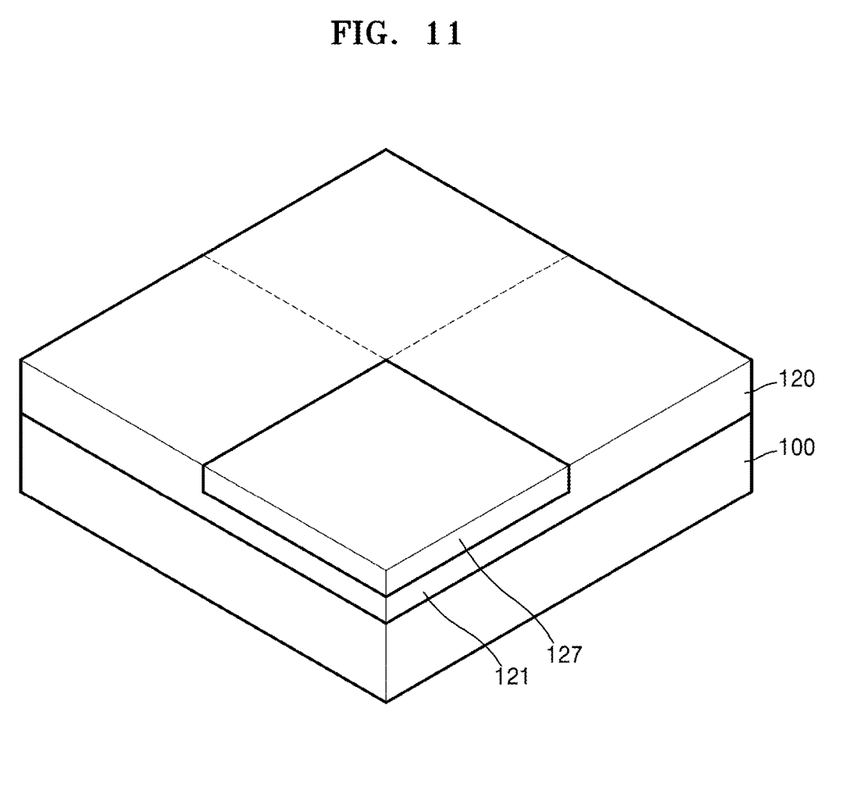

Next, referring to FIG. 11, a near-infrared light detecting material 127 may be arranged on the remaining portion 121. Thus, a near-infrared light detecting region may have a structure in which the near-infrared light detecting material 127 and the remaining portion 121 containing silicon are bonded together. In this case, the upper surface of the near-infrared light detecting material 127 and the upper surface of the rest region of the silicon layer 120 may have the same height. However, this is a non-limiting example. In another example, the upper surface of the near-infrared light detecting material 127 may be higher or lower than the upper surface of the rest region of the silicon layer 120.

Figure 12:
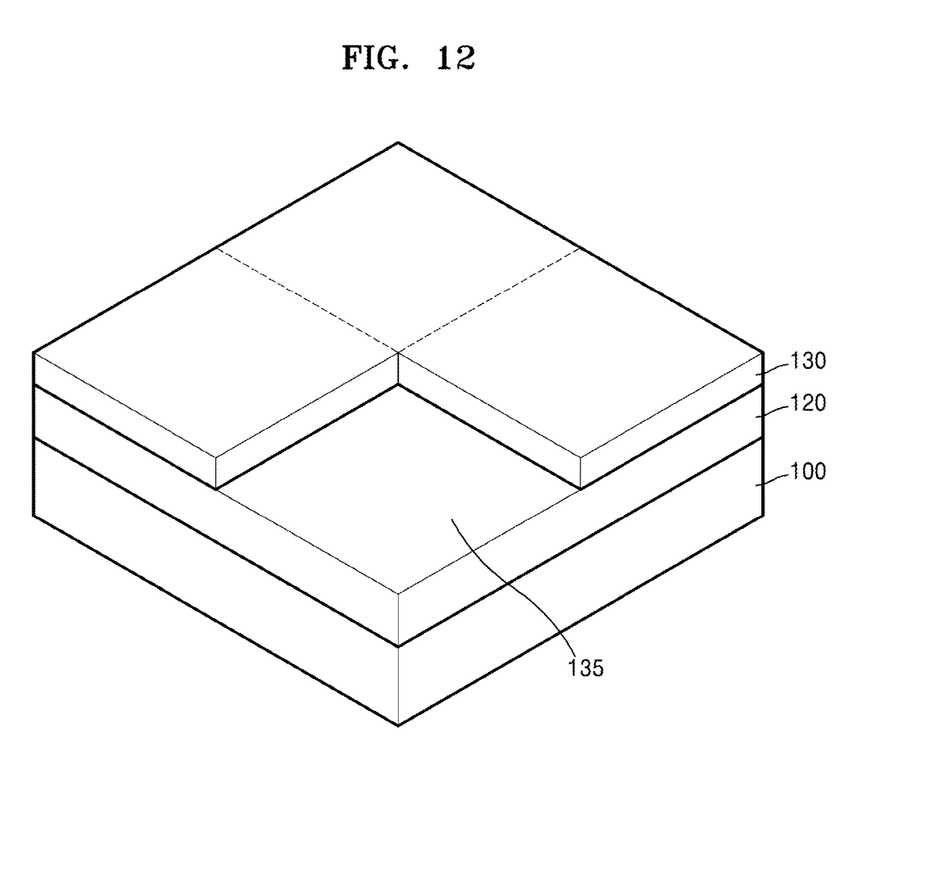

FIG. 12 illustrates another example of forming a near-infrared material layer.

Referring to FIG. 12, photoresist 130 may be placed on the silicon layer 120 shown in FIG. 7, and a region 135 of the photoresist 130 corresponding to a sub-pixel may be patterned.

Figure 13:
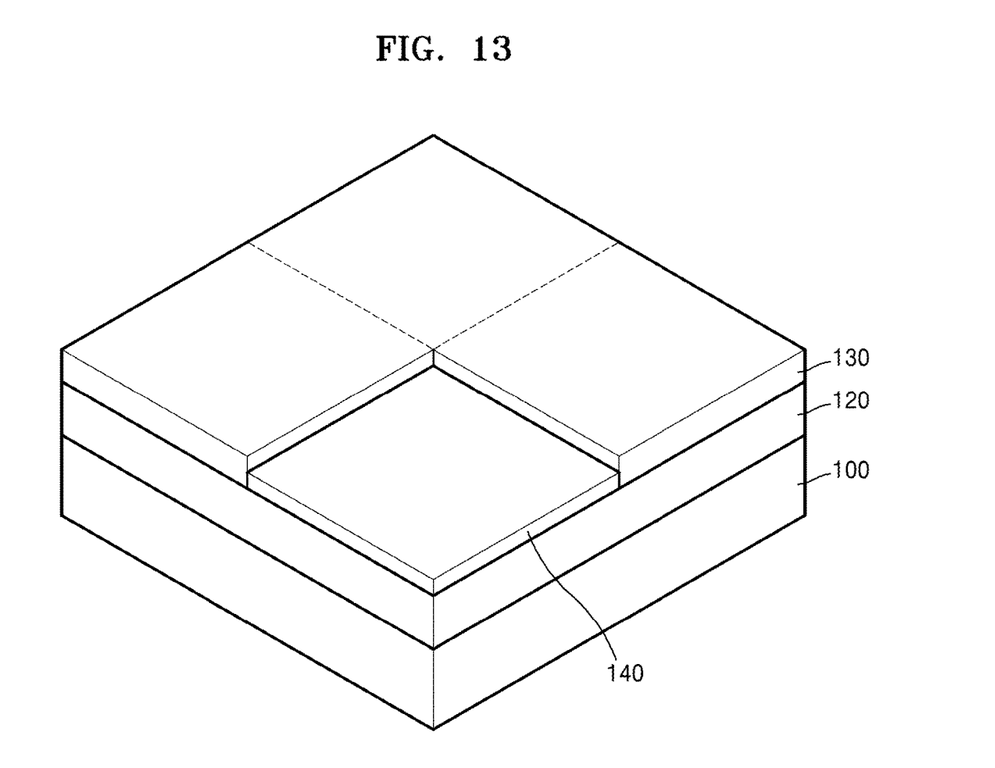

Referring to FIG. 13, a near-infrared light detecting material 140 may be placed in the patterned region 135.

Figure 14:
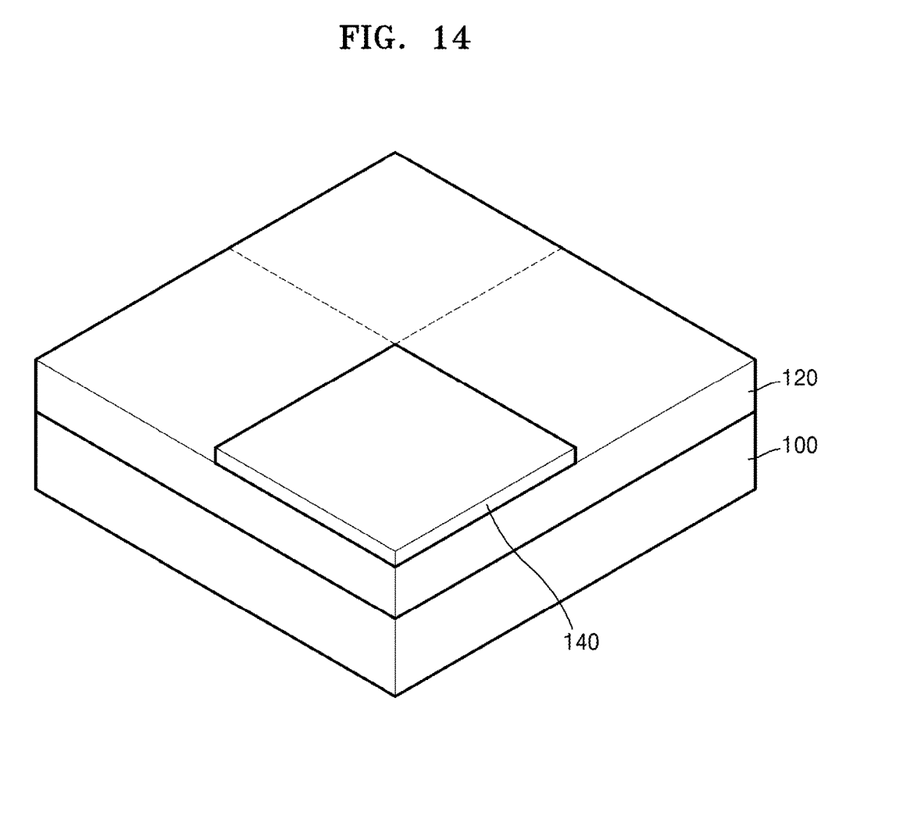

Next, referring to FIG. 14, the photoresist 130 may be removed, and then the near-infrared light detecting material 140 may remain. In this manner, the near-infrared light detecting material 140 may be provided on the silicon layer 120 to form a different material bond structure.

The image sensor of example embodiments may be manufactured by various methods. For example, the image sensor may be manufactured through simple semiconductor processes.

It should be understood that example embodiments described herein should be considered in a descriptive sense only and not for purposes of limitation. Descriptions of features or aspects within each example embodiment should typically be considered as available for other similar features or aspects in other embodiments.

While one or more example embodiments have been described with reference to the figures, it will be understood by those of ordinary skill in the art that various changes in form and details may be made therein without departing from the spirit and scope as defined by the following claims.

What is claimed is:

1. An image sensor comprising:
a plurality of color filters configured to transmit light of different wavelength bands;
a light sensing layer including a plurality of visible light detectors and at least one near-infrared light detector, each of the plurality of visible light detectors and the at least one near-infrared light detector corresponding to one of the plurality of color filters, and a material included in at least one near-infrared light detector includes at least one transition metal dichalcogenide having a transition metal atom and a chalcogen atom; and a signal processing layer configured to convert an optical signal detected by the light sensing layer into an electric signal.

2. The image sensor of claim 1, wherein the at least one near-infrared light detector is configured to detect light in a wavelength band ranging from about 800 nm to about 900 nm.

3. The image sensor of claim 1, wherein the material included in the at least one near-infrared light detector has a band gap of less than or equal to about 1.38 eV.

4. The image sensor of claim 1, wherein the at least one transition metal dichalcogenide comprises:
at least one of Molybdenum disulfide ($MoS_2$), Molybdenum Selenide ($MoSe_2$), Molybdenum ditelluride ($MoTe_2$), Tungsten diselenide ($WSe_2$), Tungsten(IV) telluride ($WTe_2$), and Hafnium telluride ($HfTe_2$).

5. The image sensor of claim 1, wherein the at least one near-infrared light detector comprises:
a first layer including the at least one transition metal dichalcogenide; and
a second layer including a semiconductor material.

6. The image sensor of claim 5, wherein the semiconductor material included in the second layer comprises silicon.

7. The image sensor of claim 1, wherein the plurality of visible light detectors and the at least one near-infrared light detector are a same size.

8. The image sensor of claim 1, further comprising:
a common electrode above the light sensing layer with respect to the signal processing layer, and
pixel electrodes in the signal processing layer.

9. The image sensor of claim 1, wherein a material included in the plurality of visible light detectors includes silicon.

10. An image sensor comprising:
a plurality of color filters configured to transmit light of different wavelength bands;
a light sensing layer including a plurality of visible light detectors and at least one near-infrared light detector, each of the plurality of visible light detectors and the at least one near-infrared light detector corresponding to one of the plurality of color filters, and a material included in at least one near-infrared light detector includes one of (i) at least one transition metal dichalcogenide having a transition metal atom and a chalcogen and (ii) black silicon; and
a signal processing layer configured to convert an optical signal detected by the light sensing layer into an electric signal, wherein
the at least one near-infrared light detector and the plurality of visible light detectors are in a same plane.

11. A method of manufacturing an image sensor, the method comprising:
forming a silicon layer on a signal processing layer;
etching a region of the silicon layer;
arranging a near-infrared light detecting material in the etched region; and
forming a color filter layer on the silicon layer and the near-infrared light detecting material.

12. The method of claim 11, wherein
the etching includes etching the region of the silicon layer to a partial depth, and
the arranging includes arranging the near-infrared light detecting material in the etched region to the partial depth.

13. The method of claim 11, wherein the near-infrared light detecting material is configured to detect light in a wavelength band ranging from about 800 nm to about 900 nm.

14. The method of claim 11, wherein the near-infrared light detecting material comprises:
a material having a band gap of less than or equal to about 1.38 eV.

15. The method of claim 11, wherein the near-infrared light detecting material comprises:
at least one transition metal dichalcogenide.

16. The method of claim 15, wherein the near-infrared light detecting material comprises:
at least one of Molybdenum disulfide ($MoS_2$), Molybdenum Selenide ($MoSe_2$), Molybdenum ditelluride ($MoTe_2$), Tungsten diselenide ($WSe_2$), Tungsten(IV) telluride ($WTe_2$), and Hafnium telluride ($HfTe_2$).

17. The method of claim 11, wherein a material included in the near-infrared light detecting material includes black silicon.

* * * * *